United States Patent
Kim

(10) Patent No.: US 9,070,476 B2
(45) Date of Patent: Jun. 30, 2015

(54) REFRESH CIRCUITS

(71) Applicant: SK hynix Inc., Icheon (KR)

(72) Inventor: Dong Kyun Kim, Cheongju-si (KR)

(73) Assignee: SK Hynix Inc., Icheon (KR)

( * ) Notice: Subject to any disclaimer, the term of this patent is extended or adjusted under 35 U.S.C. 154(b) by 223 days.

(21) Appl. No.: 13/716,041

(22) Filed: Dec. 14, 2012

(65) Prior Publication Data

US 2013/0315019 A1 Nov. 28, 2013

(30) Foreign Application Priority Data

May 25, 2012 (KR) .................. 10-2012-0056373

(51) Int. Cl.
| | |
|---|---|
| G11C 11/402 | (2006.01) |
| H03L 7/00 | (2006.01) |
| H03L 1/02 | (2006.01) |
| G11C 11/406 | (2006.01) |
| H03B 19/14 | (2006.01) |

(52) U.S. Cl.
CPC .............. *G11C 11/402* (2013.01); *H03L 7/00* (2013.01); *H03L 1/022* (2013.01); *H03L 1/027* (2013.01); *G11C 11/40615* (2013.01); *G11C 11/40626* (2013.01); *H03B 19/14* (2013.01)

(58) Field of Classification Search
CPC ........... G11C 11/402; G11C 11/40615; G11C 11/40626

USPC ........... 365/222, 189.011, 149, 183; 327/142, 327/141, 198, 538, 536; 324/750.02; 331/176

See application file for complete search history.

(56) References Cited

U.S. PATENT DOCUMENTS

| | | | | |
|---|---|---|---|---|
| 4,734,641 | A | * | 3/1988 | Byrd et al. ............... 324/750.02 |
| 6,998,901 | B2 | * | 2/2006 | Lee ............................... 327/536 |
| 7,705,688 | B2 | * | 4/2010 | Hong ........................... 331/176 |
| 8,054,141 | B2 | | 11/2011 | Saw |
| 2005/0162215 | A1 | * | 7/2005 | Chang et al. ................. 327/538 |

FOREIGN PATENT DOCUMENTS

KR 1020080066249 A 7/2008

* cited by examiner

*Primary Examiner* — Kretelia Graham
*Assistant Examiner* — Alfredo Bermudez Lozada

(57) ABSTRACT

A refresh circuit includes a period signal generation circuit configured to drive a control node according to a level of the control node, discharge first and second currents from the control node in response to the first temperature signal, and generate a period signal, a division signal generator configured to divide the period signal to generate a first division signal and a second division signal, and a selector configured to select one of the first and second division signals in response to a second temperature signal and for outputting the selected division signal as a refresh signal.

28 Claims, 13 Drawing Sheets

REFRESH CIRCUITS

CROSS-REFERENCES TO RELATED APPLICATIONS

The present application claims priority under 35 U.S.C. 119(a) to Korean Application No. 10-2012-0056373, filed on May 25, 2012, in the Korean Intellectual Property Office, which is incorporated herein by reference in its entirety as set forth in full.

BACKGROUND

In general, semiconductor memory devices may be categorized as either volatile or nonvolatile memory devices. While the volatile memory devices lose their stored data when power is interrupted, the nonvolatile memory devices retain their stored data even when power is interrupted. Volatile memory devices include dynamic random access memory (DRAM) devices and static random access memory (SRAM) devices. A unit cell of the SRAM devices may include a flip flop circuit (e.g., two cross-coupled inverters) and two switching elements. Thus, the SRAM cells may stably store their data as long as power is supplied. Meanwhile, a unit cell of the DRAM devices may include a cell transistor acing as a switching element and a cell capacitor acting as a data storage element. If the cell transistor is turned on, the cell capacitor will be charged through the cell transistor to store a data bit in the capacitor.

In the DRAM devices, leakage currents may occur through the cell transistors even though the cell transistors are turned off. Thus, the data (e.g., charges) stored in the capacitors may be lost as the time elapses. Thus, the cell capacitors need to be periodically recharged to retain their stored data.

The refresh operation may be categorized as either an auto-refresh operation or a self-refresh operation. The auto-refresh operation may be executed by refresh commands outputted from a memory controller, and the self-refresh operation may be executed by self-refresh signals which are internally generated in the DRAM devices.

The self-refresh operation may be periodically executed according to a refresh cycle time determined in the DRAM devices. The refresh cycle time may be determined by a data retention time corresponding to a maximum time that the cell capacitors can retain minimum charges which is required to read a correct logic data. The data retention time may be influenced by leakage current characteristics of the cell transistors and the leakage current characteristics of the cell transistors may vary according to an internal temperature of the DRAM devices. Thus, the data retention time may be affected by the internal temperature of the DRAM devices.

As leakage currents increase with an increase of the internal temperature of the DRAM devices, the data retention time decreases with the increase of the internal temperature, and vice versa. Thus, a refresh circuit should be designed such that the refresh cycle time varies according to an internal temperature of the DRAM devices. That is, the refresh cycle time should be reduced to ensure successful operations of the DRAM device as the internal temperature of the DRAM device increases. On the other hand, the refresh cycle time should be increased to reduce the power consumption of the DRAM device as the internal temperature of the DRAM device decreases. Conventional DRAM devices include period signal generation circuits to control the refresh cycle time according to the internal temperature thereof.

SUMMARY

In an embodiment, a refresh circuit includes a period signal generation circuit, a division signal generator, and a selector. The signal generation circuit is configured to drive a control node according to a voltage level of the control node and generate first and second currents from the control node in response to a first temperature signal, the period signal generation circuit generating a period signal based on the first and second currents generated. The division signal generator is configured to divide the period signal to generate a first division signal and a second division signal. The selector is configured to select one of the first and second division signals in response to a second temperature signal and to output the selected division signal as a refresh signal. The first current has a substantially constant current level and the second current has a variable current level according to an internal temperature of the period signal generation circuit.

In an embodiment, the refresh circuit is part of a semiconductor memory device and the refresh signal is used to refresh memory cells in the semiconductor memory device. In an embodiment, the semiconductor memory device is provided in a package and the internal temperature corresponds to a temperature within the package.

In an embodiment, a refresh circuit includes a control node configured to store charges and output first and second currents; a period signal generation circuit configured to generate a period signal that is based on the first and second currents output by the control node; a division signal generator configured to divide the period signal to generate a first division signal and a second division signal; and a selector configured to select one of the first and second division signals in response to a temperature signal and output the selected division signal as a refresh signal for a memory cell. A sum of the first and second currents is substantially constant if a temperature associated with the memory cell is below a first temperature, and the sum of the first and second currents varies as the temperature associated with the memory cell increases above the first temperature.

In an embodiment, the refresh circuit is part of a semiconductor memory device having a plurality of memory cells and the refresh signal is used to refresh the memory cells in the semiconductor memory device. The semiconductor memory device is provided in a package and the temperature associated with the memory cell corresponds to a temperature within the package.

In an embodiment, a refresh circuit includes a period signal generation circuit configured to drive a control node according to a level of the control node, discharge first and second currents from the control node in response to the first temperature signal, and generate a period signal, a division signal generator configured to divide the period signal to generate a first division signal and a second division signal, and a selector configured to select one of the first and second division signals in response to a second temperature signal and to output the selected division signal as a refresh signal. The first current has a substantially constant current level and the second current has a variable current level according to an internal temperature of the refresh circuit.

In another embodiment, a refresh circuit includes a period signal generator configured to pull up a voltage level of the control node to a power supply voltage when the voltage level of the control node is lower than a voltage level of a first reference voltage signal and generate the period signal, and a discharge controller configured to generate the first and second currents discharged from the control node. The first current is linearly decreased as the internal temperature increases and the second current is nonlinearly increased as the internal temperature increases.

BRIEF DESCRIPTION OF THE DRAWINGS

Embodiments of the present invention will become more apparent in view of the attached drawings and accompanying detailed description, in which.

DETAILED DESCRIPTION

Example embodiments of the inventive concept will be described hereinafter with reference to the accompanying drawings.
However, the example embodiments described herein are for illustrative purposes only and are not intended to limit the scope of the inventive concept.

Figure 1:
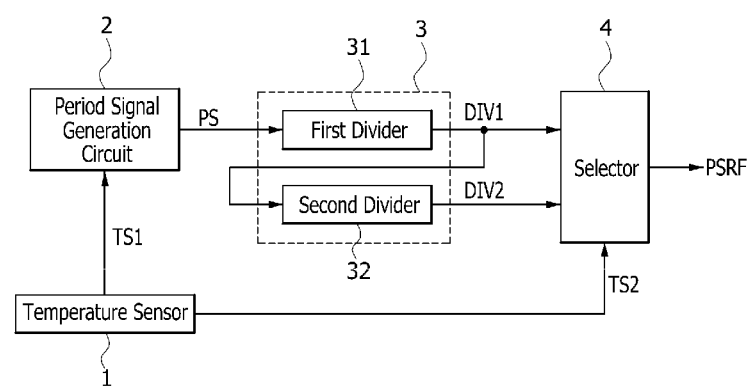
FIG. 1 is a block diagram illustrating a refresh circuit according to an embodiment of the present invention.

FIG. 1 is a block diagram illustrating a refresh circuit according to an embodiment of the present invention.

As illustrated in FIG. 1, a refresh circuit may be configured to generate a refresh signal PSRF in response to temperature signals. The refresh circuit according to the present embodiment may include a temperature sensor 1, a period signal generation circuit 2, a division signal generator 3 and a selector 4.

The temperature sensor 1 may generate a first temperature signal TS1 and a second temperature signal TS2. The first temperature signal TS1 may have a logic "high" state when an internal temperature of the refresh circuit is below a first predetermined temperature (for example, 45 degrees Celsius in the present embodiment) and may have a logic "low" state when the internal temperature of the refresh circuit is equal to or greater than the first predetermined temperature. The second temperature signal TS2 may have a logic "high" state when an internal temperature of the refresh circuit is below a second predetermined temperature (for example, 78 degrees Celsius in the present embodiment) and may have a logic "low" state when the internal temperature of the refresh circuit is equal to or greater than the second predetermined temperature. The logic levels of the first and second temperature signals TS1 and TS2 as well as the temperature values of the first and second predetermined temperatures are not limited to the values provided above. That is, in some embodiments, the logic levels of the first and second temperature signals TS1 and TS2 as well as the temperature values of the first and second predetermined temperatures may be set to have different values from the above descriptions.

The period signal generation circuit 2 may generate a period signal PS having a certain cycle time (e.g., a certain period) which is controlled in response to the first temperature signal TS1. Hereafter, more detailed configurations and operations of the period signal generation circuit 2 will be described with reference to FIGS. 2 to 7.

The division signal generator 3 may be configured to generate a plurality of division signals having a different period from that of the period signal PS. In an embodiment, the division signal generator 3 may include a first divider 31 and a second divider 32. The first divider 31 may divide the period signal PS to generate a first division signal DIV1, and the second divider 32 may divide the first division signal DIV1 to generate a second division signal DIV2. The first division signal DIV1 may have a period which is equal to "N" times that of the period signal PS. The second division signal DIV2 may have a period which is equal to "M" times that of the first division signal DIV1 and "M*N" times that of the period signal PS. Here, "N" and "M" denote natural numbers.

The selector 4 may be configured to select one of the first and second division signals DIV1 and DIV2 in response to the second temperature signal TS2 to output it as a refresh signal PSRF. In an embodiment, when the internal temperature is below the second predetermined temperature, the selector 4 may receive the second temperature signal TS2 having a logic "high" state to output the second division signal DIV2 as the refresh signal PSRF. Further, when the internal temperature is equal to or greater than the second predetermined temperature, the selector 4 may receive the second temperature signal TS2 having a logic "low" state to output the first division signal DIV1 as the refresh signal PSRF.

Figure 2:
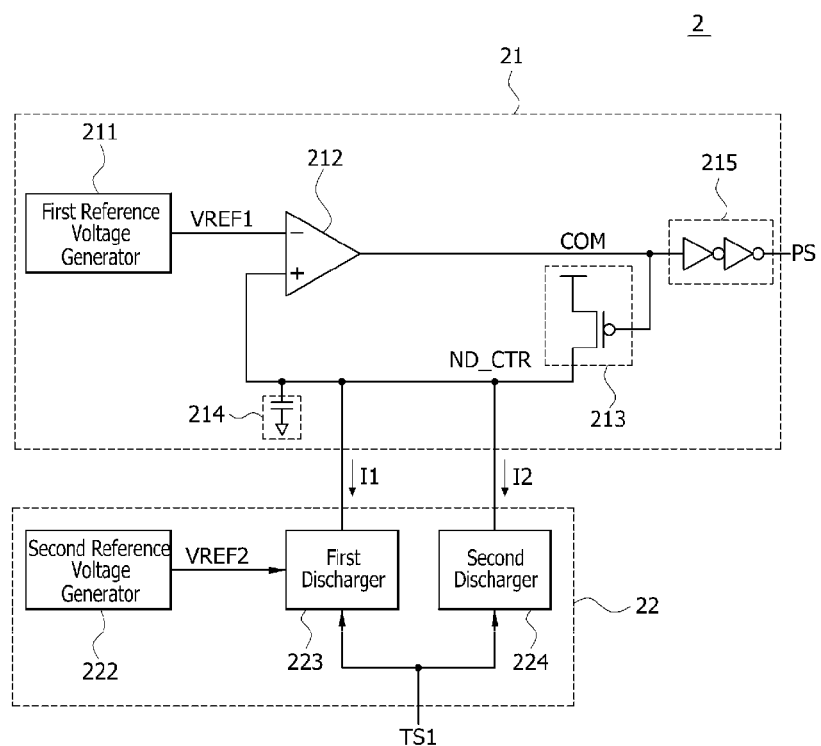
FIG. 2 illustrates a configuration of a period signal generation circuit included in a refresh circuit shown in FIG. 1 according to an embodiment of the present invention.

FIG. 2 illustrates a configuration of a period signal generation circuit included in a refresh circuit shown in FIG. 1.

As illustrated in FIG. 2, the period signal generation circuit 2 may be configured to include a period signal generator 21 and a discharge controller 22.

The period signal generator 21 may include a first reference voltage generator 211, a comparator 212, a driver 213, a stabilizer 214 and a buffer 215. The first reference voltage generator 211 may generate a first reference voltage signal VREF1 having a first reference voltage with a constant voltage level. The comparator 212 may compare a signal (e.g., a voltage signal) induced at a control node ND_CTR with the first reference voltage signal VREF1 to generate a comparison signal COM. The stabilizer 214 is configured to stabilize the voltage of the control node ND_CTR. In an embodiment, the stabilizer 214 includes a capacitor which is charged by the control node ND_CTR. Thus, the stabilizer 214 may stabilize the voltage level of the control node ND_CTR. The buffer 215 is configured to buffer the comparison signal COM to generate a period signal PS. The buffer 215 may be a plurality of inverters and/or other components suitable for buffering and generating the period signal PS.

In an embodiment, the comparison signal COM is enabled initially to have a logic "low" state when the voltage of the control node ND_CTR has a lower level than the first reference voltage signal VREF1. Accordingly, a periodic signal PS is in a logic "low" state. The driver 213 receives the comparison signal COM having a logic "low" state to turn on the PMOS in the driver 213 for pulling up the voltage of the control node ND_CTR to a power supply voltage. As a result, the comparison signal COM is enabled to have a logic "high" state and the periodic signal PS having a logic "high" state is outputted. The PMOS of the driver 213 receives the logic "high" state and is turned off. The voltage of the control node ND_CTR is decreased until the voltage ND_CTR has a lower level than the first reference voltage signal VREF1, due to discharged currents from the control node ND_CTR as described below. Then, the comparison signal COM is enabled to have the logic "low" state once again. The periodic signals PSRFN of "high" and "low" signals are generated in this manner.

The discharge controller 22 is configured to discharge the charges stored in the control node ND_CTR as needed. In an embodiment, the discharger controller 22 may include a second reference voltage generator 222, a first discharger 223 and a second discharger 224. The second reference voltage generator 222 may generate a second reference voltage signal VREF2 having a constant voltage level regardless of a variation in the internal temperature or a variable voltage level that linearly varies according to a variation of the internal temperature. The first discharger 223 may generate a first current I1 which is discharged from the control node ND_CTR in response to the second reference voltage signal VREF2. The first current I1 may flow through the first discharger 223 and may have a constant current level regardless of a variation in the internal temperature. The second discharger 224 may generate a second current I2 which is discharged from the control node ND_CTR. The second current I2 may flow through the second discharger 224 and may have a variable current level which is nonlinearly increased as the internal temperature increases.

In an operation, one of the first and second dischargers 223 and 224 may selectively operate according to the first temperature signal TS1 to discharge the charges stored in the control node ND_CTR. That is, when the first temperature signal TS1 has a logic "high" state (e.g., when the internal temperature is below 45 degrees Celsius), the first discharger 223 may operate to generate the first current I1 from the control node ND_CTR. On the other hand, when the first temperature signal TS1 has a logic "low" state (e.g., when the internal temperature is equal to or greater than 45 degrees Celsius), the second discharger 224 may operate to generate the second current I2 from the control node ND_CTR.

Hereinafter, configurations of the second reference voltage generator 222, the first discharger 223 and the second discharger 224 will be described more fully with reference to FIGS. 3, 4, 5 and 6.

Figure 3:
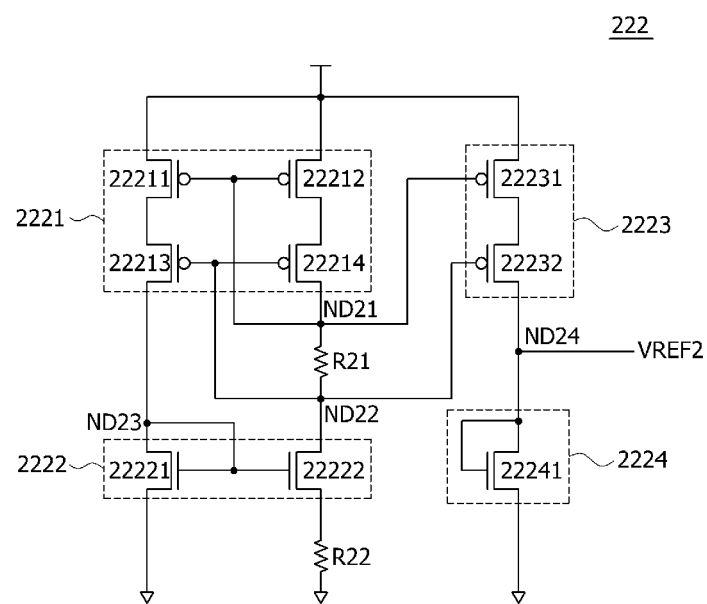
FIG. 3 is a circuit diagram illustrating a second reference voltage generator included in a period signal generation circuit shown in FIG. 2 according to an embodiment of the present invention.

As illustrated in FIG. 3, the second reference voltage generator 222 may be configured to include a first current source 2221, a second current source 2222, a reference voltage driver 2223, a linearity controller 2224, and resistors R21 and R22. The first current source 2221 may operate as a constant current source in response to a voltage of a node ND21 and a voltage of a node ND22, thereby supplying charges to the node ND21. In an embodiment, the first current source 2221 includes two sets of two PMOS transistors connected in series. The node ND21 and the node ND22 are electrically connected to a gate of the upper PMOS transistors 22211 and 22212 and of the lower PMOS transistors 22213 and 22214 of each set, respectively.

The second current source 2222 may operate as a constant current source in response to a voltage of a node ND23, thereby discharging the node ND22. In an embodiment, the second current source 2222 includes two NMOS resistors 22221 and 22222. The left NMOS transistor 22221 of the second current source 2222 is a saturated MOS transistor whose gate is connected to the node ND23. The right NMOS transistor 22222 is electronically connected to a ground voltage through the resistor R22. The node ND21 and the node ND22 are electrically connected by the resistor R21.

The reference voltage driver 2223 is configured to output the second reference voltage signal VREF2. In an embodiment, the reference voltage driver 2223 includes two PMOS transistors 22231 and 22232 connected in series. The linearity controller 2224 may be electrically connected to an output node of the reference voltage driver 2223. The second reference voltage signal VREF2 may be outputted from a node ND24 between the reference voltage driver 2223 and the linearity controller 2224, i.e., via the output node of the reference voltage driver 2223. In an embodiment, the linearity controller 2224 includes a diode element 22241 composed of a saturated MOS transistor.

In an operation, the NMOS transistor 22222 in the second current source 2222 connecting the node ND22 and the resistor R22 may operate in the weak inversion mode and a current flowing through the NMOS transistor 22222 may be increased in proportion to the internal temperature. Because a level of the current flowing through the NMOS transistor 22222 may be substantially the same as a level of a variable current entering into the output node ND24 of the second reference voltage, the level of the variable current entering into the node ND24 may be also increased in proportion to the internal temperature. The level of the current flowing through the reference voltage driver 2223 via the node ND24 may be adjusted by changing the resistor R22 and the beta ratio of the NMOS transistors 22221 and 22222 in the second current source 2222.

On the other hand, a level of the variable current discharged from the output node ND24 of the second reference voltage through the saturated MOS transistor 22241 may be increased in proportion to the internal temperature, because the threshold voltage of the saturated MOS transistor 22241 is decreased with an increase of the internal temperature. A slope of the variable current discharged from the output node ND24 may be controlled by adjusting a size (e.g., a ratio of a channel width to a channel length) of the saturated MOS transistor 22241.

As a result, when the levels of the variable currents discharged from and entering into the output node ND24 are substantially equal to each other, a level of the second reference voltage signal VREF2 may be maintained constant regardless of a variation in the internal temperature. When the level of the variable current discharged from the output node ND24 is smaller than that of the variable current entering into the output node ND24, the second reference voltage signal VREF2 outputted from the second reference voltage generator 222 is increased in proportion to the internal temperature, and vice versa. In this way, the second reference voltage signal VREF2 may be generated to have a constant voltage level regardless of the variation in the internal temperature, or a variable voltage level that varies linearly with the internal temperature.

Figure 4:
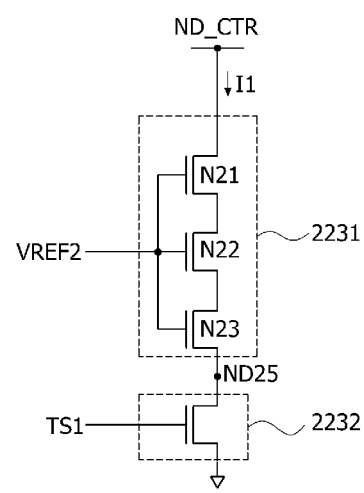
FIG. 4 is a circuit diagram illustrating a first discharger included in a period signal generation circuit shown in FIG. 2 according to an embodiment of the present invention.

FIG. 4 illustrates the first discharger 223 that is configured to generate the first current I1 when the internal temperature is below a predetermined temperature (e.g., 45 degrees Celsius) according to an embodiment of the present invention. The first discharger 223 may be configured to include a switching portion 2231 and an activating portion 2232. The switching portion 2231 may include NMOS transistors N21, N22 and N23 which are turned on when the second reference voltage signal VREF2 is applied to gates of the NMOS transistors N21, N22 and N23. When the second reference voltage signal VREF2 is applied to the gates of the NMOS transistors N21, N22 and N23, charges stored in the control node ND_CTR may be discharged through the NMOS transistors N21, N22 and N23 to generate the first current I1 flowing from the control node ND_CTR toward a node ND25. When the first temperature signal TS1 has a logic "high" state representing that the internal temperature is below the predetermined temperature (e.g., 45 degrees Celsius), the activating portion 2232 may electrically connect the node ND25 to a ground voltage terminal to activate the operation of the switching portion 2231. As a result, the first discharger 223 may generate the first current I1 which is discharged from the control node ND_CTR when the internal temperature is below the first predetermined temperature (e.g., 45 degrees Celsius).

Figure 5:
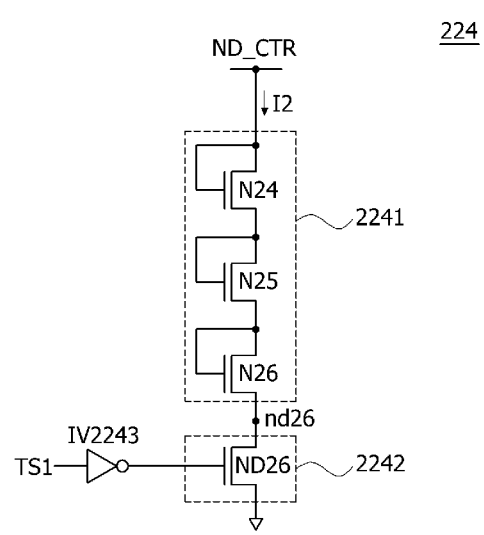
FIG. 5 is a circuit diagram illustrating a second discharger included in a period signal generation circuit shown in FIG. 2 according to an embodiment of the present invention.

FIG. 5 illustrates the second discharger 224 may be configured to include a diode portion 2241 and an activating portion 2242. The diode portion 2241 may include saturated NMOS transistors N24, N25 and N26 which are serially connected to each other, thereby providing an electrical path connected to the control node ND_CTR. The charges stored in the control node ND_CTR may be discharged through the saturated NMOS transistors N24, N25 and N26 to generate the second current I2 flowing from the control node ND_CTR towards a node ND26, when the first temperature signal TS1 has a logic "low" state representing that the internal temperature is equal to or greater than the predetermined temperature. The activating portion 2242 may electrically connect the node ND26 to a ground voltage terminal to activate the operation of the diode portion 2241 when the temperature signal TS is "low" since it is converted to "high" by the inverter IV2243. That is, the second discharger 224 may generate the second current I2 based on the charges discharged from the control node ND_CTR when the internal temperature is equal to or greater than the first predetermined temperature (e.g., 45 degrees Celsius).

Figure 6:
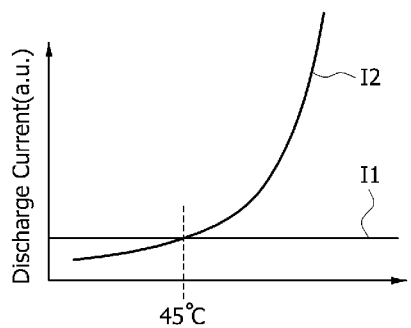
FIG. 6 is a graph illustrating discharge currents of first and second dischargers of FIG. 2 as a function of an internal temperature of a refresh circuit shown in FIG. 1 according to an embodiment of the present invention.

Referring to FIG. 6, the first current I1 discharged through the first discharger 223 and the second current I2 discharged through the second discharger 224 may be plotted as a function of the internal temperature. That is, the first current I1 may be constant or uniform regardless of a variation in the internal temperature. However, in some embodiments, the first current I1 may linearly increase or decrease according to a variation in the internal temperature. The second current I2 may be nonlinearly (e.g., exponentially) increased as the internal temperature increases.

Hereinafter, operations of the period signal generation circuit 2 for generating the period signal PS will be described when the internal temperature is below the first predetermined temperature (e.g., 45 degrees Celsius) and when the internal temperature is equal to or greater than the first predetermined temperature (e.g., 45 degrees Celsius).

Figure 7:
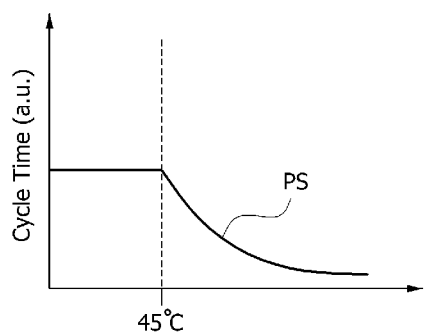
FIG. 7 is a graph illustrating cycle times of a period signal outputted from a period signal generation circuit shown in FIG. 2 as a function of an internal temperature of a refresh circuit shown in FIG. 1 according to an embodiment of the present invention.

First, when the internal temperature is below the first predetermined temperature (e.g., 45 degrees Celsius), the first temperature signal TS1 may have a logic "high" state. The activating portion 2232 of the first discharger 223 (see FIG. 4) is enabled while the activating portion 2242 of the second discharger 224 (see FIG. 5) is not enabled. In such a case, the control node ND_CTR may be charged by the activation of the driver 213 (see FIG. 2) if the voltage of the control node ND_CTR is lower than the first reference voltage (a voltage of the first reference voltage signal VREF1) and may be discharged by the activation of the first discharger 223 if the voltage of the control node ND_CTR is higher than the first reference voltage (a voltage of the first reference voltage signal VREF1). Since the first current I1 flowing through the first discharger 223 is constant when the internal temperature is below the first predetermined temperature, a level transition period of the comparison signal COM may be constant. Accordingly, the period (e.g., a cycle time) of the period signal PS may be constant when the internal temperature is below the first predetermined temperature (e.g., 45 degrees Celsius), as illustrated in FIG. 7.

Next, when the internal temperature is equal to or greater than the first predetermined temperature (e.g., 45 degrees Celsius), the first temperature signal TS1 may have a logic "low" state. The activating portion 2242 of the second discharger 224 (see FIG. 5) is enabled while the activating portion 2232 of the first discharger 223 (see FIG. 4) is not enabled. In such a case, the control node ND_CTR may be charged by the activation of the driver 213 (see FIG. 2) if the voltage of the control node ND_CTR is lower than the first reference voltage (a voltage of the first reference voltage signal VREF1) and may be discharged by the activation of the second discharger 224 if the voltage of the control node ND_CTR is higher than the first reference voltage (a voltage of the first reference voltage signal VREF1). The second current I2 flowing through the second discharger 224 may be nonlinearly (e.g., exponentially) increased as the internal temperature increases over the first predetermined temperature. Thus, a level transition period of the comparison signal COM may be nonlinearly reduced as the internal temperature increases over the predetermined temperature. Therefore, the period (e.g., a cycle time) of the period signal PS may be nonlinearly reduced as the internal temperature increases over the predetermined temperature (e.g., 45 degrees Celsius), as illustrated in FIG. 7.

The period signal generation circuit 2 according to the present embodiment may be realized without any oscillators and any comparators to compare a plurality of oscillating signals outputted from the oscillators. Thus, the period signal generation circuit may be simplified to increase the integration density thereof. In addition, the period signal generation circuit according to the present embodiment may operate without comparison of oscillating signals, thereby preventing the occurrence of a malfunction resulted from comparisons of the plurality of oscillating signals with similar periods. As a result, the period signal generation circuit according to the present embodiment may stably operate.

Operations of the refresh circuit including the period signal generation circuit 2 will be described hereinafter.

First, the period signal generation circuit 2 may generate the period signal PS having a variable period (e.g., a variable cycle time) in response to the first temperature signal TS1. The period of the period signal PS may have a constant value when the internal temperature is below the first predetermined temperature (e.g., 45 degrees Celsius). In contrast, when the internal temperature is equal to or greater than the first predetermined temperature (e.g., 45 degrees Celsius), the period of the period signal PS may be nonlinearly (e.g., exponentially) decreased as the internal temperature increases.

Next, the division signal generator 3 (see FIG. 1) may divide the period signal PS to generate the first division signal DIV1 having a period which is "N" times that of the period signal PS. Further, the division signal generator may divide the first division signal DIV1 to generate the second division signal DIV2 having a period which is "M" times that of the first division signal DIV1 and is "N*M" times that of the period signal PS.

In an embodiment, the selector 4 (see FIG. 1) may be configured to select one of the first and second division signals DIV1 and DIV2 in response to the second temperature signal TS2, thereby outputting the selected division signal as the refresh signal PSRF. When the internal temperature is below the second predetermined temperature (e.g., 78 degrees Celsius), the selector 4 may receive the second temperature signal TS2 having a logic "high" state to output the second division signal DIV2 as the refresh signal PSRF. In contrast, when the internal temperature is equal to or greater than the second predetermined temperature, the selector 4 may receive the second temperature signal TS2 having a logic "low" state to output the first division signal DIV1 as the refresh signal PSRF.

Figure 8:
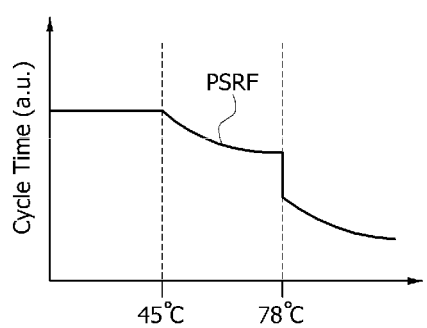
FIG. 8 is a graph illustrating cycle times of a refresh signal outputted from a refresh circuit shown in FIG. 1 as a function of an internal temperature of the refresh circuit according to an embodiment of the present invention.

The period (e.g., the cycle time) of the refresh signal PSRF outputted from the refresh circuit may be plotted as the internal temperature, as illustrated in FIG. 8. As illustrated in FIG. 8, when the internal temperature is below the second predetermined temperature (e.g., 78 degrees Celsius), the refresh signal PSRF may be generated by selecting the second division signal DIV2 having a period which is "N*M" times that of the period signal PS. Meanwhile, the period signal PS may be constant below the first predetermined temperature (e.g., 45 degrees Celsius) and be nonlinearly decreased over the first predetermined temperature. Thus, when the internal temperature is below the first predetermined temperature (e.g., 45 degrees Celsius), the period (e.g., the cycle time) of the refresh signal PSRF which is "N*M" times that of the period signal PS may be constant because the period signal PS is constant. In addition, when the internal temperature is between the first predetermined temperature (e.g., 45 degrees Celsius) and the second predetermined temperature (e.g., 78 degrees Celsius), the period (e.g., the cycle time) of the refresh signal PSRF having a period which is also "N*M" times that of the period signal PS may be nonlinearly decreased as the internal temperature increases because the period signal PS is nonlinearly decreased.

When the internal temperature is equal to or greater than the second predetermined temperature (e.g., 78 degrees Celsius), the refresh signal PSFR may be generated by selecting the first division signal DIV1 having a period which is "N" times of the period signal PS. Thus, when the internal temperature is over the second predetermined temperature, the period (e.g., the cycle time) of the refresh signal PSRF which is "N" times that of the period signal PS may be nonlinearly reduced as the internal temperature increases because the period signal PS is nonlinearly reduced. At the second predetermined temperature, the period of the refresh signal PSRF may be discontinuously decreased because the period of PSRF is decreased discontinuously from "N*M" times to "N" times the period of the period signal PS as shown in FIG. 8.

Figure 9:
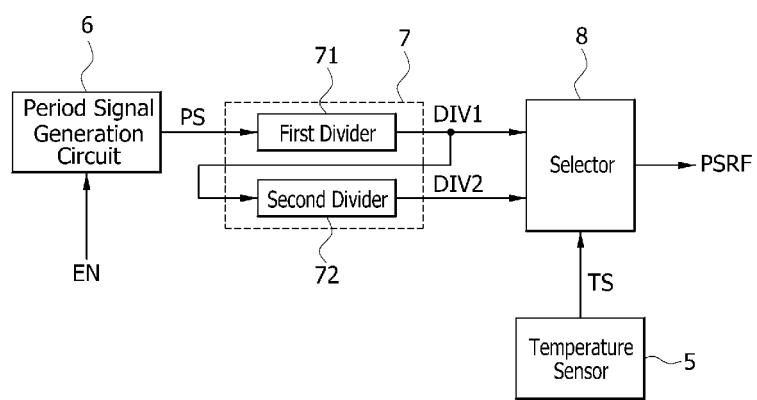
FIG. 9 is a block diagram illustrating a refresh circuit according to another embodiment of the present invention.

FIG. 9 illustrates a configuration of a refresh circuit according to another embodiment of the present invention.

As illustrated in FIG. 9, a refresh circuit according to the present embodiment may be configured to include a temperature sensor 5, a period signal generation circuit 6, a division signal generator 7 and a selector 8.

The temperature sensor 5 may generate a temperature signal TS. The temperature signal TS may have a logic "high" state when an internal temperature is below a second predetermined temperature (e.g., 78 degrees Celsius in the present embodiment) and may have a logic "low" state when the internal temperature is equal to or greater than the second predetermined temperature (e.g., 78 degrees Celsius in the present embodiment). The logic levels of the temperature signal TS as well as the temperature value of the second predetermined temperature may not be limited to the above descriptions. That is, in some embodiments, the logic levels of the temperature signal TS as well as the temperature value of the second predetermined temperature may be set to have different values from the above descriptions.

The period signal generation circuit 6 may generate a period signal PS having a certain cycle time (e.g., a certain period) which is controlled in response to an enable signal EN. More detailed configurations and operations of the period signal generation circuit 6 will be described with reference to FIGS. 10 to 13 later.

The division signal generator 7 may be configured to generate a plurality of division signals having a different period from that of the period signal PS. In an embodiment, the division signal generator 7 may include a first divider 71 and a second divider 72. The first divider 71 may divide the period signal PS to generate a first division signal DIV1, and the second divider 72 may divide the first division signal DIV1 to generate a second division signal DIV2. The first division signal DIV1 may have a period which is equal to "N" times that of the period signal PS. The second division signal DIV2 may have a period which is equal to "M" times that of the first division signal DIV1 and "M*N" times that of the period signal PS. Here, "N" and "M" denote natural numbers.

The selector 8 may be configured to select one of the first and second division signals DIV1 and DIV2 in response to the temperature signal TS to output it as a refresh signal PSRF. In an embodiment, when the internal temperature is below the second predetermined temperature, the selector 8 may receive the temperature signal TS having a logic "high" state to output the second division signal DIV2 as the refresh signal PSRF. Further, when the internal temperature is equal to or greater than the second predetermined temperature, the selector 8 may receive the temperature signal TS having a logic "low" state to output the first division signal DIV1 as the refresh signal PSRF.

Figure 10:
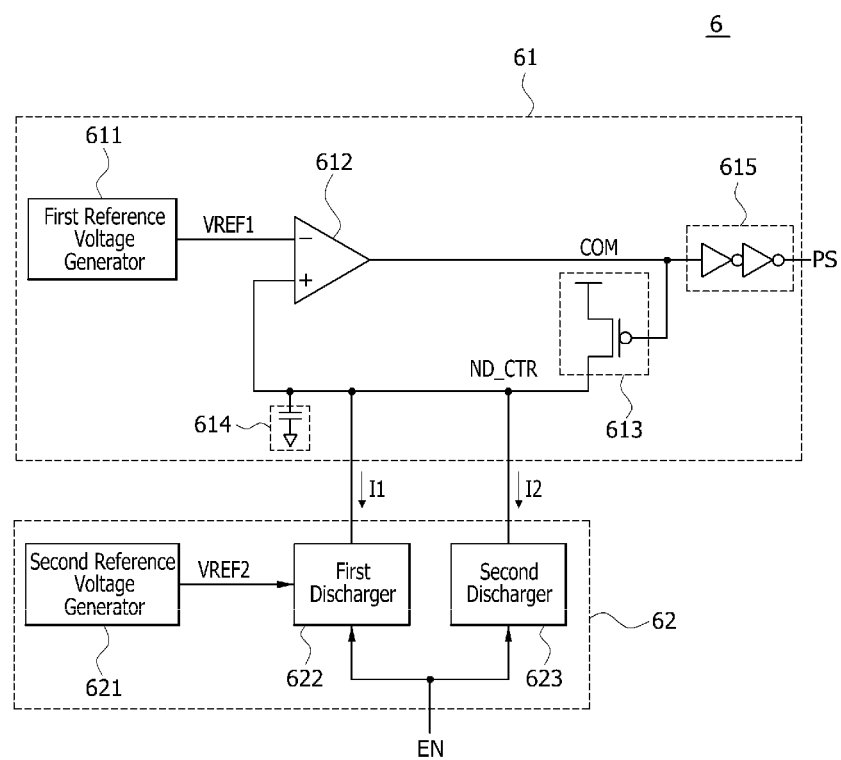
FIG. 10 illustrates a configuration of a period signal generation circuit included in a refresh circuit shown in FIG. 9 according to an embodiment of the present invention.

FIG. 10 illustrates a configuration of a period signal generation circuit included in a refresh circuit shown in FIG. 9.

As illustrated in FIG. 10, the period signal generation circuit 6 may be configured to include a period signal generator 61 and a discharge controller 62.

The period signal generator 61 may include a first reference voltage generator 611, a comparator 612, a driver 613, a stabilizer 614 and a buffer 615. The first reference voltage generator 611 may generate a first reference voltage signal VREF1 having a first reference voltage with a constant voltage level. The comparator 612 may compare a signal (e.g., a voltage signal) induced at a control node ND_CTR with the first reference voltage signal VREF1 to generate a comparison signal COM. The driver 613 may receive the comparison signal COM having a logic "low" state to pull up the voltage of the control node ND_CTR to a power supply voltage. The stabilizer 614 may include a capacitor which is charged by charges supplied from the control node ND_CTR. Thus, the stabilizer 614 is configured to stabilize the voltage of the control node ND_CTR. In an embodiment, the stabilizer 614 may stabilize the voltage level of the control node ND_CTR. The buffer 615 is configured to buffer the comparison signal COM to generate a period signal PS. The buffer 615 may be a plurality of inverters and/or other components suitable for buffering and generating the period signal PS. The period signal generator 61 may have the same configuration as the period signal generator 21 illustrated in FIG. 2. Thus, to avoid duplicate explanation, further detailed descriptions to the period signal generator 61 will be omitted in this embodiment.

The discharge controller 62 is configured to discharge the charges stored in the control node ND_CTR as needed. In an embodiment, the discharge controller 62 may include a second reference voltage generator 621, a first discharger 622 and a second discharger 623. The second reference voltage generator 621 may generate a second reference voltage signal VREF2 having a constant voltage level regardless of variation of the internal temperature or a variable voltage level that linearly varies according to variation of the internal temperature. The first discharger 622 may generate a first current I1 which is discharged from the control node ND_CTR in response to the second reference voltage signal VREF2. The first current I1 may flow through the first discharger 622 and may be linearly decreased as the internal temperature increases. The second discharger 623 may generate a second current I2 which is discharged from the control node ND_CTR. The second current I2 may flow through the second discharger 623 and may be nonlinearly increased as the internal temperature increases.

In an operation, both the first and second dischargers 622 and 623 may simultaneously operate in response to an enable signal EN to generate the first and second currents I1 and I2 from the control node ND_CTR. The enable signal EN may be enabled to have a logic "high" state to generate a period signal PS. When the internal temperature is below a predetermined temperature (e.g., 45 degrees Celsius), a sum of the first and second currents I1 and I2 may be substantially constant. On the other hand, when the internal temperature is equal to or greater than the first predetermined temperature, the sum of the first and second currents I1 and I2 may be nonlinearly increased as the internal temperature increases. The second reference voltage generator 621 may be realized to have the same configuration as the second reference voltage generator 222 illustrated in FIG. 3. Thus, to avoid duplicate explanation, detailed descriptions to the second reference voltage generator 61 will be omitted in this embodiment.

Hereinafter, configurations of the first discharger 622 and the second discharger 623 will be described more fully with reference to FIGS. 11 and 12.

Figure 11:
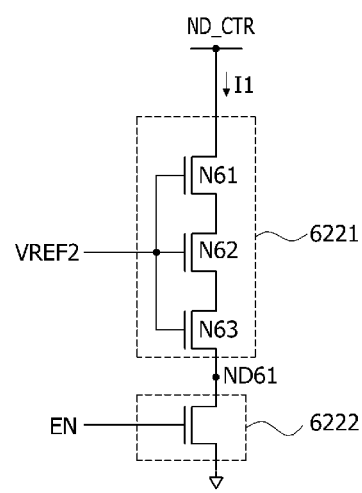
FIG. 11 is a circuit diagram illustrating a first discharger included in a period signal generation circuit shown in FIG. 10 according to an embodiment of the present invention.

FIG. 11 illustrates the first discharger 622 may be configured to include a switching portion 6221 and an activating portion 6222 according to an embodiment of the present invention. The switching portion 6221 may include NMOS transistors N61, N62 and N63 which are serially connected to each other, and the NMOS transistors N61, N62 and N63 may be turned on when the second reference voltage signal VREF2 is applied to gates of the NMOS transistors N61, N62 and N63. When the second reference voltage signal VREF2 is applied to the gates of the NMOS transistors N61, N62 and N63, charges stored in the control node ND_CTR may be discharged through the NMOS transistors N61, N62 and N63 to generate the first current I1 flowing from the control node ND_CTR towards a node ND61. In an embodiment, the first current I1 may be linearly decreased when a level of the second reference voltage signal VREF2 decreases with an increase of the internal temperature. When the enable signal EN has a logic "high" state, the activating portion 6222 may electrically connect the node ND61 to a ground voltage terminal to activate the operation of the switching portion 6221. As a result, the first discharger 622 may generate the first current I1 from the charges discharged from the control node ND_CTR when the enable signal EN has the logic "high" state.

Figure 12:
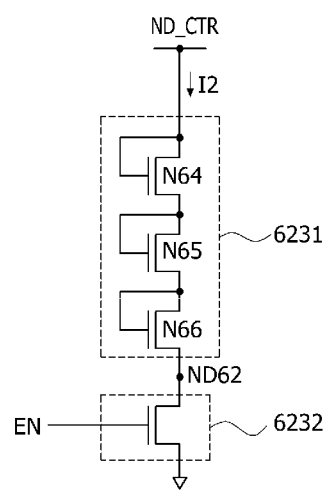
FIG. 12 is a circuit diagram illustrating a second discharger included in a period signal generation circuit shown in FIG. 10 according to an embodiment of the present invention.

FIG. 12 illustrates the second discharger 623 that is configured to generate the second current I2 when the enable signal EN has the logic "high" state according to an embodiment of the present invention. The second discharger 623 may be configured to include a diode portion 6231 and an activating portion 6232. The diode portion 6231 may include saturated NMOS transistors N64, N65 and N66 which are serially connected to each other, thereby providing an electrical path connected to the control node ND_CTR. The charges stored in the control node ND_CTR may be discharged through the saturated NMOS transistors N64, N65 and N66 to generate the second current I2 flowing from the control node ND_CTR towards a node ND62. In an embodiment, the second current I2 may be nonlinearly increased as the internal temperature increases because the threshold voltages of the saturated NMOS transistors N64, N65, and N66 are decreased. When the enable signal EN has a logic "high" state, the activating portion 6232 may electrically connect the node ND62 to a ground voltage terminal to activate the operation of the diode portion 6231. As a result, the second discharger 623 may generate the second current I2 from the charges discharged from the control node ND_CTR when the enable signal EN has the logic "high" state.

Figure 13:
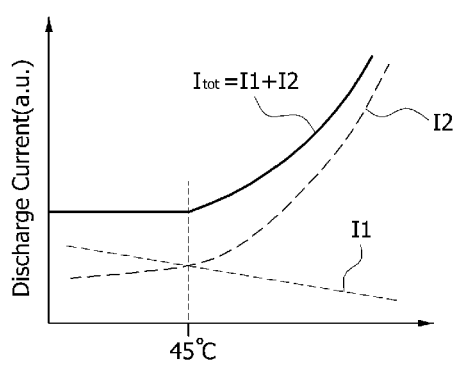
FIG. 13 is a graph illustrating discharge currents of first and second dischargers of FIG. 10 as a function of an internal temperature of a refresh circuit shown in FIG. 9 according to an embodiment of the present invention.

Referring to FIG. 13, the first current I1 discharged through the first discharger 622 and the second current I2 discharged through the second discharger 623 may be plotted as a function of the internal temperature. That is, the first current I1 may be linearly decreased as the internal temperature increases, and the second current I2 may be nonlinearly (e.g., exponentially) increased as the internal temperature increases. A sum (e.g., a total current $I_{tot}$) of the first and second currents I1 and I2 may be substantially constant when the internal temperature is below the first predetermined temperature (e.g., 45 degrees Celsius). This is because the second current I2 shows an approximately linear behavior when the internal temperature is below the predetermined temperature. In this region, the second current I2 is increased linearly when the internal temperature increases. As the first current I1 is decreased linearly as the internal temperature increases in the same region, the sum of the first and second currents I1 and I2 may be constant if the linearly decreasing slope of the first current I1 matches the correspondingly increasing slope of the second current I2. On the other hand, the total current $I_{tot}$ (i.e., the sum of the first and second currents I1 and I2) may be nonlinearly increased as the internal temperature increases over the first predetermined temperature (e.g., 45 degrees Celsius). This is because the second current I2 increases nonlinearly with a faster rate (e.g., exponentially) than the linearly decreasing rate of the first current I1 so that the nonlinearly increasing behavior of the second current I2 dominates the linearly decreasing behavior of the first current I1, when the internal temperature increases over the predetermined temperature.

The operations of the period signal generation circuit according to the present embodiment will be described in more detail hereinafter when the internal temperature is below the first predetermined temperature (e.g., 45 degrees Celsius) and when the internal temperature is equal to or greater than the first predetermined temperature (e.g., 45 degrees Celsius).

First, when the internal temperature is below the first predetermined temperature (e.g., 45 degrees Celsius), the control node ND_CTR may be charged by the activation of the driver

613 (see FIG. 10) if the voltage of the control node ND_CTR is lower than the first reference voltage (a voltage of the first reference voltage signal VREF1) and may be discharged by the activation of the first and second dischargers 622 and 623 if the voltage of the control node ND_CTR is higher than the first reference voltage (a voltage of the first reference voltage signal VREF1). When the internal temperature is below the first predetermined temperature (e.g., 45 degrees Celsius), the total current $I_{tot}$ (i.e., the sum of the first and second currents I1 and I2) discharged by the first and second dischargers 622 and 623 may be substantially constant. Thus, the period (e.g., a cycle time) of the period signal PS may be constant when the internal temperature is below the first predetermined temperature.

Next, when the internal temperature is equal to or greater than the predetermined temperature (e.g., 45 degrees Celsius), the total current $I_{tot}$ (i.e., the sum of the first and second currents I1 and I2) discharged by the first and second dischargers 622 and 623 may be nonlinearly increased as the internal temperature increases. Since a level transition period of the period signal PS is inversely proportional to the total current $I_{tot}$, the period (e.g., a cycle time) of the period signal PS may be nonlinearly reduced as the internal temperature increases over the first predetermined temperature (e.g., 45 degrees Celsius).

The period signal PS generated by the period signal generation circuit may be applicable to self-refresh circuits or other circuits that periodically operate. The period signal generation circuit according to an embodiment of the present invention may be implemented without any temperature sensors or circuits for generating a plurality of oscillation signals and for comparing the plurality of oscillation signals. Thus, the period signal generation circuit may be simplified to increase the integration density thereof. Further, the period signal generation circuit according to the embodiment of the present embodiment may operate without comparison of oscillating signals, thereby preventing a malfunction resulted from comparing the oscillating signals having similar periods. As a result, the period signal generation circuit according to the present embodiment may stably operate.

Operations of the refresh circuit including the period signal generation circuit 6 will be described hereinafter.

First, the period signal generation circuit 6 may generate the period signal PS having a period (e.g., a cycle time) that can be determined according to whether the internal temperature is lower than the first predetermined temperature or not. The period of the period signal PS may have a constant value when the internal temperature is below the first predetermined temperature (e.g., 45 degrees Celsius). In contrast, when the internal temperature is equal to or greater than the first predetermined temperature (e.g., 45 degrees Celsius), the period of the period signal PS may be nonlinearly (e.g., exponentially) decreased as the internal temperature increases.

Next, the division signal generator 7 may divide the period signal PS to generate the first division signal DIV1 having a period which is "N" times that of the period signal PS. Further, the division signal generator 7 may divide the first division signal DIV1 to generate the second division signal DIV2 having a period which is "M" times that of the first division signal DIV1 and is "N*M" times that of the period signal PS.

In an embodiment, the selector 8 may be configured to select one of the first and second division signals DIV1 and DIV2 in response to the temperature signal TS, thereby outputting the selected division signal as the refresh signal PSRF. When the internal temperature is below the second predetermined temperature (e.g., 78 degrees Celsius), the selector 8 may receive the temperature signal TS having a logic "high" state to output the second division signal DIV2 as the refresh signal PSRF. Further, when the internal temperature is equal to or greater than the second predetermined temperature, the selector 8 may receive the temperature signal TS having a logic "low" state to output the first division signal DIV1 as the refresh signal PSRF.

As described above, the refresh signal PSRF may be generated by selecting the second division signal DIV2 when the internal temperature is below the second predetermined temperature (e.g., 78 degrees Celsius) and may be generated by selecting the first division signal DIV1 when the internal temperature is over the second predetermined temperature (e.g., 78 degrees Celsius). Thus, when the internal temperature is below the first predetermined temperature (e.g., 45 degrees Celsius), the period (e.g., the cycle time) of the refresh signal PSRF which is "N*M" times that of the period signal PS may be constant because the period of the period signal PS is constant. In addition, when the internal temperature is between the first predetermined temperature and the second predetermined temperature, the period (e.g., the cycle time) of the refresh signal PSRF may be nonlinearly reduced as the internal temperature increases because the period of the period signal PS is nonlinearly decreased. Moreover, when the internal temperature is over the second predetermined temperature, the period (e.g., the cycle time) of the refresh signal PSRF which is "N" times that of the period signal PS may also be nonlinearly reduced as the internal temperature increases because the period of the period signal PS is nonlinearly decreased. At the second predetermined temperature, the period of the refresh signal PSRF may be discontinuously decreased because the period of PSRF is decreased discontinuously from "N*M" times to "N" times the period of the period signal PS.

The example embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:
1. A refresh circuit comprising:
a period signal generation circuit configured to drive a control node according to a voltage level of the control node and generate first and second currents from the control node in response to a first temperature signal, the period signal generation circuit generating a period signal based on the first and second currents generated;
a division signal generator configured to divide the period signal to generate a first division signal and a second division signal; and
a selector configured to select one of the first and second division signals in response to a second temperature signal and to output the selected division signal as a refresh signal,
wherein the period signal generation circuit is configured to generate the first current when the first temperature signal has a first level, and to generate the second current when the first temperature signal has a second level.

2. The refresh circuit of claim 1, wherein the refresh circuit is a part of a semiconductor memory device and the refresh signal is used to refresh memory cells in the semiconductor memory device.

3. The refresh circuit of claim 1, wherein the division signal generator includes:
a first divider configured to divide the period signal to generate the first division signal; and a second divider configured to divide the first division signal to generate the second division signal.

4. The refresh circuit of claim 1, wherein the first temperature signal transitions from one logic level to another logic level if an internal temperature reaches a first predetermined temperature, and the second temperature signal transitions from one logic level to another logic level if the internal temperature reaches a second predetermined temperature which is higher than the first predetermined temperature.

5. The refresh circuit of claim 1, wherein the period signal generation circuit includes:
the control node;
a period signal generator configured to pull up the voltage level of the control node to a power supply voltage if the voltage level of the control node is lower than a voltage level of a first reference voltage signal and generate the period signal;
a discharge controller configured to generate the first and second currents based on charges discharged from the control node in response to the first temperature signal; and
an output node configured to output the period signal having a period that varies according the first and second currents,
wherein the second current is nonlinearly increased as an internal temperature increases.

6. The refresh circuit of claim 5, wherein the period signal generator includes:
a comparator configured to compare the voltage level of the control node with the first reference voltage to generate a comparison signal;
a driver configured to pull up the voltage level of the control node to the power supply voltage in response to the comparison signal; and
a buffer configured to buffer the comparison signal to generate the period signal.

7. The refresh circuit of claim 5, wherein the discharge controller includes:
a first discharger coupled to the control node and configured to generate the first current by discharging the control node in response to the first temperature signal; and
a second discharger coupled to the control node and configured to generate the second current by discharging the control node in response to the first temperature signal,
wherein the first and second dischargers are configured to be selectively enabled in response to the first temperature signal which transitions from the first level to the second level if the internal temperature reaches a first predetermined temperature.

8. The refresh circuit of claim 7, wherein the first discharger includes:
a switching portion configured to be turned on in response to a second reference voltage signal and generate the first current based on charges discharged from the control node; and
an activating portion configured to activate the switching portion in response to the first temperature signal.

9. The refresh circuit of claim 8, wherein the switching portion of the first discharger includes at least one MOS transistor which is turned on if the second reference voltage signal is applied to a gate of the at least one MOS transistor.

10. The refresh circuit of claim 8, wherein the second reference voltage signal has a substantially constant voltage level regardless of a variation in the internal temperature or a variable voltage level that linearly varies with the internal temperature.

11. The refresh circuit of claim 10, further comprising a reference voltage generator for generating the second reference voltage signal, wherein the reference voltage generator includes:
a first resistor coupling a first node to a second node;
a first current source operating as a substantially constant current source in response to voltages of the first and second nodes;
a second current source coupled to the second node to operate as a substantially constant current source in response to a voltage of a third node;
a second resistor coupled to the second current source;
a reference voltage driver for driving the second reference voltage signal in response to the voltages of the first and second nodes; and
a linearity controller electrically coupled to an output node of the reference voltage driver,
wherein the second reference voltage signal is outputted through the output node of the reference voltage driver.

12. The refresh circuit of claim 7, wherein the second discharger includes:
a diode portion configured to have at least one diode element to generate the second current based on the charges discharged from the control node; and
an activating portion configured to activate the diode portion in response to the first temperature signal.

13. A refresh circuit comprising:
a period signal generation circuit configured to drive a control node according to a voltage level of the control node and generate a period signal based on first and second currents discharged from the control node;
a division signal generator configured to divide the period signal to generate a first division signal and a second division signal; and
a selector configured to select one of the first and second division signals in response to a temperature signal and output the selected division signal as a refresh signal,
wherein a total current of the first and second currents is substantially constant when an internal temperature of the period signal generation circuit is below a first predetermined temperature, and the total current of the first and second currents varies as the internal temperature increases above the first predetermined temperature, and
wherein the period signal generation circuit includes a first discharger coupled to the control node and configured to generate the first current by discharging the control node in response to an enable signal and a second discharger coupled to the control node and configured to generate the second current by discharging the control node in response to the enable signal.

14. The refresh circuit of claim 13, wherein the refresh circuit is a part of a semiconductor memory device and the refresh signal is used to refresh memory cells in the semiconductor memory device.

15. The refresh circuit of claim 14, wherein the semiconductor memory device is provided in a package and the internal temperature corresponds to a temperature within the package.

16. The refresh circuit of claim 13, wherein the division signal generator includes:
a first divider configured to divide the period signal to generate the first division signal; and
a second divider configured to divide the first division signal to generate the second division signal.

17. The refresh circuit of claim 13, wherein the temperature signal transitions from one logic level to another logic level at a second predetermined temperature which is higher than the first predetermined temperature.

18. The refresh circuit of claim 13, wherein the total current of the first and second currents is nonlinearly increased as the internal temperature increases above the first predetermined temperature.

19. The refresh circuit of claim 18, wherein the period signal generation circuit further includes:
a period signal generator configured to pull up the voltage level of the control node to a power supply voltage when the voltage level of the control node is lower than a voltage level of a first reference voltage signal and generate the period signal; and
an output node configured to output the period signal having a period that varies according the first and the second currents,
wherein the first current is linearly decreased as the internal temperature increases and the second current is nonlinearly increased as the internal temperature increases.

20. The refresh circuit of claim 19, wherein the period signal generator includes:
a comparator configured to compare the voltage of the control node with the first reference voltage signal to generate a comparison signal;
a driver configured to pull up the voltage of the control node to the power supply voltage in response to the comparison signal; and
a buffer configured to buffer the comparison signal to generate the period signal.

21. The refresh circuit of claim 13, wherein the first discharger includes:
a switching portion configured to be turned on in response to a second reference voltage signal to generate the first current discharged from the control node; and
an activating portion configured to activate the switching portion in response to the enable signal.

22. The refresh circuit of claim 21, wherein the switching portion includes at least one MOS transistor which is turned on when the second reference voltage signal is applied to a gate of the at least one MOS transistor.

23. The refresh circuit of claim 21, wherein the second reference voltage signal has a variable voltage level that linearly decreases as the internal temperature increases.

24. The refresh circuit of claim 23, further comprising a reference voltage generator for generating the second reference voltage signal, wherein the reference voltage generator includes:
a first resistor for electrically coupling a first node to a second node;
a first current source operating as a substantially constant current source in response to voltages of the first and second nodes;
a second current source coupled to the second node to operate as a substantially constant current source in response to a voltage of a third node;
a second resistor coupled to the second current source;
a reference voltage driver for driving the second reference voltage signal in response to the voltages of the first and second nodes; and
a linearity controller electrically coupled to an output node of the reference voltage driver,
wherein the second reference voltage signal is outputted through the output node of the reference voltage driver.

25. The refresh circuit of claim 13, wherein the second discharger includes:
a diode portion configured to have at least one diode element to generate the second current discharged from the control node; and
an activating portion configured to activate the diode portion in response to the enable signal.

26. A refresh circuit comprising:
a control node configured to store charges and output first and second currents;
a period signal generation circuit configured to generate a period signal that is based on the first and second currents output by the control node;
a division signal generator configured to divide the period signal to generate a first division signal and a second division signal; and
a selector configured to select one of the first and second division signals in response to a temperature signal and output the selected division signal as a refresh signal for a memory cell,
wherein a sum of the first and second currents is substantially constant if a temperature associated with the memory cell is below a first temperature, and the sum of the first and second currents varies as the temperature associated with the memory cell increases above the first temperature, and
wherein the period signal generation circuit includes a first discharger coupled to the control node and configured to generate the first current by discharging the control node in response to an enable signal and a second discharger coupled to the control node and configured to generate the second current by discharging the control node in response to the enable signal.

27. The refresh circuit of claim 26, wherein the refresh circuit is a part of a semiconductor memory device having a plurality of memory cells and the refresh signal is used to refresh the memory cells in the semiconductor memory device, and
wherein the semiconductor memory device is provided in a package and the temperature associated with the memory cell corresponds to a temperature within the package.

28. The refresh circuit of claim 1, wherein the period signal generation circuit is configured to generate only the first current of the first and second currents when the first temperature signal has a first value, and to generate only the second current of the first and second currents when the first temperature signal has a second value.

* * * * *